(12) United States Patent
Torregrosa et al.

(10) Patent No.: US 11,053,582 B2
(45) Date of Patent: Jul. 6, 2021

(54) SUPPORT INCLUDING AN ELECTROSTATIC SUBSTRATE CARRIER

(71) Applicant: ION BEAM SERVICES, Peynier (FR)

(72) Inventors: Frank Torregrosa, Simiane (FR); Laurent Roux, Marseilles (FR)

(73) Assignee: ION BEAM SERVICES, Peynier (FR)

( * ) Notice: Subject to any disclaimer, the term of this patent is extended or adjusted under 35 U.S.C. 154(b) by 875 days.

(21) Appl. No.: 14/367,015

(22) PCT Filed: Dec. 19, 2012

(86) PCT No.: PCT/FR2012/000530
§ 371 (c)(1),
(2) Date: Jun. 19, 2014

(87) PCT Pub. No.: WO2013/093238
PCT Pub. Date: Jun. 27, 2013

(65) Prior Publication Data
US 2014/0326176 A1    Nov. 6, 2014

(30) Foreign Application Priority Data

Dec. 21, 2011    (FR) ........................... 1103981

(51) Int. Cl.
*C23C 14/50*    (2006.01)
*C23C 14/48*    (2006.01)
(Continued)

(52) U.S. Cl.
CPC .............. *C23C 14/50* (2013.01); *C23C 14/48* (2013.01); *H01L 21/67069* (2013.01);
(Continued)

(58) Field of Classification Search
CPC ..... C23C 14/50; C23C 14/48; H01L 21/6831; H01L 21/68; H01L 21/6833; H01L 21/67069
(Continued)

(56) References Cited

U.S. PATENT DOCUMENTS 4,502,094 A * 2/1985 Lewin ................. H01L 21/6831
    118/500
5,545,849 A * 8/1996 Kondo ................... H03H 9/059
    174/549

(Continued)

FOREIGN PATENT DOCUMENTS

WO    99/14796 A1    3/1999

OTHER PUBLICATIONS

International Search Report for PCT/FR2012/000530, dated Mar. 14, 2013.
French Search Report for FR 1103981, dated Apr. 25, 2012.

*Primary Examiner* — Lee D Wilson
*Assistant Examiner* — Seahee Hong
(74) *Attorney, Agent, or Firm* — Sughrue Mion, PLLC

(57) ABSTRACT

The present invention provides a support that comprises:
an electrically conductive biased table;
an insulating electrostatic substrate carrier 20 in the form of a cylinder having a shoulder 21, the bottom face of the substrate carrier 20 facing the biased table and its top face 22 presenting a bearing plane designed to receive a substrate; and
an electrically conductive clamping collar for clamping the shoulder 21 against the biased table.
The support also has at least one electrically conductive element 201-202-203 for connecting the bearing plane to the shoulder 211.

11 Claims, 2 Drawing Sheets

(51) Int. Cl.
*H01L 21/683* (2006.01)
*H01L 21/67* (2006.01)
(52) U.S. Cl.
CPC .... *H01L 21/67248* (2013.01); *H01L 21/6831* (2013.01); *H01L 21/6833* (2013.01)
(58) Field of Classification Search
USPC ........................ 361/234; 156/345.51, 345.53
See application file for complete search history.

(56) References Cited

U.S. PATENT DOCUMENTS

| | | | | |
|---|---|---|---|---|
| 5,764,471 | A * | 6/1998 | Burkhart | H01L 21/6833 361/234 |
| 6,292,346 | B1 * | 9/2001 | Ohno | H01L 21/67103 29/592.1 |
| 6,646,233 | B2 * | 11/2003 | Kanno | H01L 21/6831 118/724 |
| 2005/0042881 | A1 | 2/2005 | Nishimoto et al. | |
| 2006/0016561 | A1 | 1/2006 | Choi et al. | |
| 2010/0078129 | A1 | 4/2010 | Himori et al. | |

* cited by examiner

SUPPORT INCLUDING AN ELECTROSTATIC SUBSTRATE CARRIER

CROSS REFERENCE TO RELATED APPLICATIONS

This application is a National Stage of International Application No. PCT/FR2012/000530, filed Dec. 19, 2012, claiming priority from French Patent Application No. 1103981, filed Dec. 21, 2011, the contents of all of which are incorporated herein by reference in their entirety.

The present invention relates to a support including an electrostatic substrate carrier.

The field of the invention is that of treating parts in a low-pressure atmosphere, the parts being mounted on a support and being subjected to heating.

This relates mainly to microelectronics where the treated parts are substrates. More particularly, the invention relates to implanting ions that enable impurities to be introduced within the substrate: a technique that is known as "doping". Doping serves to modify certain properties of the substrate, be they mechanical, thermal, electrical, hydrophobic, etc.

In order to perform such implanting, it is nowadays possible to use an ion implanter that operates in plasma immersion mode. Thus, implanting ions in a substrate consists in immersing the substrate in a plasma and in biasing it with a negative voltage lying in the range several tens of volts to several tens of kilovolts (generally less than 100 kV), for the purpose of creating an electric field capable of accelerating the ions of the plasma towards the substrate so that they become implanted therein. The atoms that are implanted in this way are referred to as dopants. The bias is generally pulsed.

The penetration depth of the ions is determined by their acceleration energy. It depends firstly on the voltage applied to the substrate and secondly on the respective natures of the ions and of the substrate. The concentration of implanted atoms depends on the dose, expressed as a number of ions per square centimeter ($cm^2$), and on the implantation depth.

Implantation is performed in an evacuated enclosure such that heat is exchanged solely by radiation, thus making it possible to control the temperature of the substrate correctly.

Document U.S. Pat. No. 7,126,808 B2 proposes an appliance having a support fitted with an electrostatic substrate carrier that includes a refrigeration chamber. That appliance comprises a substrate carrier having a plurality of channels that extend between its top face and its bottom face. There is a lift pin in each channel. The lift pins serve mainly to lift the substrate a little above the substrate carrier in order to provide electrostatic clamping. The space that exists between the substrate and the substrate carrier is filled with a refrigerating gas.

The substrate is held solely at the periphery of the substrate carrier, and that is not satisfactory, mechanically speaking.

Another known support is shown in FIG. 1. That support essentially comprises three portions:
 a bias table 10;
 a substrate carrier 20; and
 a clamping collar 30.

The table 10 is biased to the high voltage (direct current (DC) or pulsed) and it is in the form of a conductive platen having a duct 11 that opens out into both of its faces. The function of the duct 11 is described in greater detail.

The insulating substrate carrier 20 rests on the table 10 via a gasket 12 arranged at the periphery of the bottom face of the substrate carrier. It is in the form of a cylinder that bears against its top face, the cylinder being provided with a shoulder 21 that projects from its base.

The clamping collar 30 serves to clamp the substrate carrier 20 on the table 10 by bearing against the shoulder 21, with this being done by means of a plurality of screws 31.

The top face 22 of the substrate carrier 20 presents a ring 23 at its periphery and it also presents a plurality of studs 24 distributed within the ring. The thicknesses of the ring 23 and of the studs 24 are identical, lying typically in the range 10 micrometers (µm) to 15 µm. The tops of the ring 23 and of the studs 24 thus define a bearing plane on which the substrate 40 rests.

Electrodes of a first type are used for electrostatically clamping the substrate. These electrodes are arranged in pairs. They are provided in a plane parallel to the top face 22, which plane is very close to the top face. They are made by any means known to the person skilled in the art, e.g. by having recourse to the so-called "thick layer" technology.

The pair that is located on the right in the figure comprises a positive electrode 25 or anode, and a negative electrode 26 or cathode. The principle consists in providing two capacitors:
 an anode-substrate capacitor; and
 a substrate-cathode capacitor.

Furthermore, it is appropriate to ensure that there is electrical contact between the substrate 40 and the biased table 10, with this being done by means of electrodes of a second type.

For this purpose, a plurality of channels pass right through the substrate carrier 20. The channel 27 on the right in the figure receives a pin 28 mounted on a spring 29 that bears against the table 10 and that therefore presses the pin 28 against the substrate 40. The pin-spring pair constitutes an electrode of the second type and one such pair is provided in each channel.

The duct 11 formed through the table serves to fill the first space that appears between the bottom face of the substrate carrier 20 and the table with helium.

The second space lying between the top face 22 of the substrate carrier 20 and the substrate 40 is also filled with helium through the channel. It is even possible to provide an additional opening (not shown) that passes through the substrate carrier in order to put the first and second spaces into communication with each other.

The means suitable for manipulating the substrate are omitted since they are known to the person skilled in the art.

During implantation, the implanting current is drained by the electrodes of the second type. The contact area of the pins 28 is small so the current density is high. This can lead to the pins melting and to the rear face of the substrate being contaminated, particularly if the bias voltage is pulsed.

An object of the present invention is thus to increase the surface area through which the implanting current passes.

According to the invention, a support comprises:
 an electrically conductive biased table;
 an insulating electrostatic substrate carrier in the form of a cylinder having a shoulder, the bottom face of the substrate carrier facing the biased table and its top face presenting a bearing plane designed to receive a substrate; and
 an electrically conductive clamping collar for clamping the shoulder against the biased table;
 the support also includes at least one electrically conductive element for connecting the bearing plane to the shoulder.

In a first embodiment, the electrically conductive element comprises:

a first strip arranged at the periphery of the top face;

a second strip that extends over the cylinder between the first strip and the shoulder; and a third strip in contact with the second strip and arranged on the shoulder.

Advantageously, it also includes a plurality of electrodes that pass through the substrate carrier and that provide electrical contact between the biased table and the bearing plane.

In a second embodiment, the electrically conductive element comprises:

an electrically conductive contact plane arranged in the substrate carrier at the shoulder; and a plurality of electrodes connected to the contact plane that project from the top face to define the bearing plane.

Preferably, the support further includes a strip arranged at the periphery of the top face under the bearing plane, and the substrate carrier includes at least one orifice opening out in its top face and its bottom face.

According to an additional characteristic of the invention, the support further includes an electrically conductive layer interposed between the top face and the biased table.

Advantageously, the electrodes are in the form of plated-through holes.

Optionally, the support further includes a gasket at the periphery of the bottom face in contact with the biased table.

Alternatively, the support further includes a thermally conductive layer interposed between the bottom face and the biased table.

The present invention appears below in greater detail in the context of the following description of embodiments given by way of illustration with reference to the accompanying figures, in which.

Elements that are present in more than one of the figures are given the same references in each of them.

The invention thus seeks to establish electrical contact between the bearing plane of the substrate carrier and the shoulder of the substrate carrier.

Figure 2:
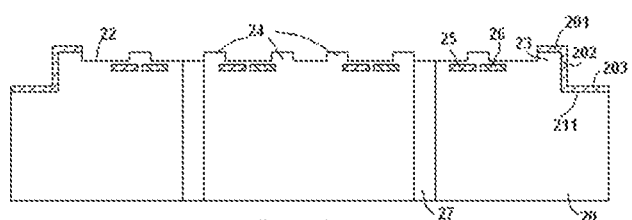
FIG. 2 is a diagram in section of a first embodiment of a support of the invention.

With reference to FIG. 2, in a first embodiment, the above-described substrate carrier 20 is used once more.

A first metal strip 201 is arranged on the ring 23 that appears at the periphery of the top face 22 of the substrate carrier 20. It is made for example by the so-called "thin layer" technology using a material such as titanium, titanium nitride, platinum, tungsten, or tungsten carbide. In any event it needs to be a material that is conductive, and if possible it should be refractory.

The thickness of the strip must be sufficient to present acceptable resistance but it must not be too great so as to ensure that the substrate does indeed rest on the studs 24. A suitable value for this thickness lies in the range 1 µm to 2 µm.

A second metal strip 202 is deposited on the cylindrical wall of the substrate carrier 20 between the first strip 201 and the upper surface 211 of a shoulder.

Finally, a third metal strip 203 is deposited on the face 211 of the shoulder that faces the clamping collar 30 and serves as a clamping surface.

The three strips that are juxtaposed in this way provide electrical continuity from the bearing face to the clamping collar, which is itself conductive.

The area of the electrical contact against the substrate is thus greatly increased, thereby improving the drainage of charge due to the implantation current. It is even possible to envisage eliminating the electrodes of the second type that used to provide contact between the rear face of the substrate 40 and the biased table 10.

If those electrodes are omitted, it is nevertheless necessary to conserve at least one channel 27 for conveying helium from the first space that appears between the bottom face of the substrate carrier 20 and the table 10 to the second face that lies between the top face 22 of the substrate carrier 20 and the substrate 40.

It is thus possible to omit these electrodes of the second type, to conserve them, or indeed to change their configuration.

By conserving a channel 27 and by metal-plating it, it is possible to provide a so-called "plated-through" hole. The plated-through hole provides electrical contact between the bearing plane and the bottom face of the substrate carrier 20.

Figure 3:
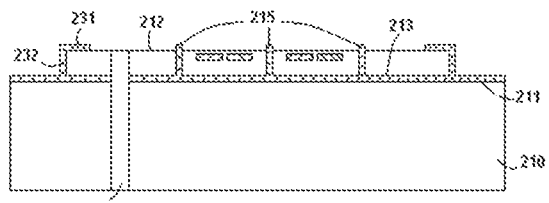
FIG. 3 is a diagram in section of a second embodiment of a support of the invention.

With reference to FIG. 3, in a second embodiment, the substrate carrier 210 is identical to the above substrate carrier, except that its top face 212 is plane since the ring and the studs have been omitted.

The substrate carrier 210 now has an electrically conductive contact plane 213 that is perpendicular to the axis of the cylinder and that covers the upper surface 211 of the shoulder.

A plurality of electrodes 215 of a third type are arranged perpendicularly to the contact plane and project from the top face 212 of the substrate carrier 210. These electrodes are in contact with the contact plane and they therefore project a little from the top face 212, by about 10 µm to 15 µm. By way of example, they constitute plated-through holes.

The first metal strip 231 is conserved, which strip is deposited at the periphery of the top face 212 of the substrate carrier 210. This first strip 231 comes substantially to the same level as the electrodes 215 of the third type. This first strip contributes to sealing the assembly comprising the substrate and the substrate carrier so as to limit leaks of helium at the periphery of the substrate.

The second metal strip 232 is preferably also conserved to connect the first strip 231 to the contact face 213, still for the purpose of improving drainage of charge due to the implantation current.

An orifice 217 is still provided that passes right through the substrate carrier to put the first space that exists between the bottom face of the substrate carrier 210 of the table 10 into communication with the second space lying between the top face 212 of the substrate carrier 210 and the substrate 40.

The substrate carrier 210 as described above is easily made by having recourse to "thick layer" technology.

For the electrodes 215 of the third type, it is possible to provide metal inserts instead of the plated-through holes.

Figure 1:
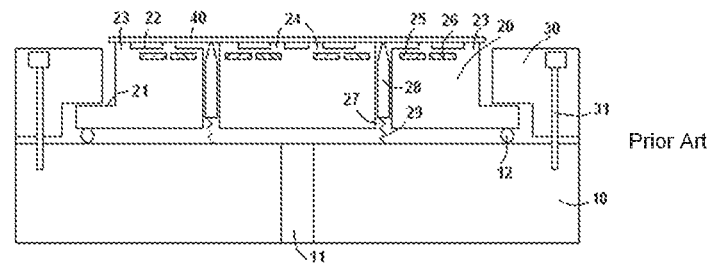
FIG. 1 is a diagram in section of a prior art support.

Returning to FIG. 1, it is appropriate to obtain the best possible exchange of heat between the substrate carrier 20 and the table 10.

For this purpose, a first solution consists in filling the space that appears between these two elements with helium by means of the duct 11.

Figure 4:
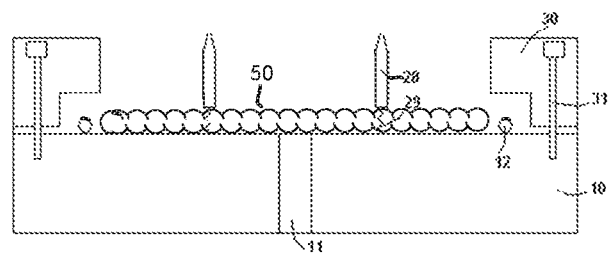
FIG. 4 is a diagram in section of the biased table 10 and clamping collar 30 and related elements which may be used in conjunction with the carriers of FIG. 2 and FIG. 3 to form a support according to the present invention.

Another solution consists in interposing between these two elements a thermally conductive layer such as adhesive, grease, or an indium sheet, as shown schematically at 50 in FIG. 4. Depending on circumstances, this layer may advantageously also be electrically conductive. Under such circumstances, it is nevertheless still necessary to provide a circuit so that helium can reach the space lying between the substrate 40 and the substrate carrier 20.

Above, only helium has been mentioned as a heat-transfer gas. The invention is equally applicable if some other gas is used such as hydrogen, for example.

The embodiments of the invention that are described above have been selected because of their concrete nature. Nevertheless, it is not possible to list exhaustively all possible embodiments covered by the invention. In particular, any of the means described may be replaced by equivalent means without going beyond the ambit of the present invention.

The invention claimed is:

1. A support comprising:
   an electrically conductive biased table;
   an insulating electrostatic substrate carrier in the form of a cylinder having a shoulder, a bottom face of the substrate carrier facing said biased table and a top face of the substrate carrier presenting a bearing plane designed to receive a substrate; and
   an electrically conductive clamping collar for contacting said shoulder at least at a clamping surface of said shoulder and clamping said shoulder against said biased table, said electrically conductive clamping collar configured to clamp, with a plurality of fasteners, the insulating electrostatic substrate carrier to the electrically conductive biased table by bearing against the shoulder;
   wherein the support includes at least one electrically conductive element for connecting said bearing plane to said clamping surface of said shoulder, wherein said at least one electrically conductive element includes an electrically conductive shoulder portion disposed at said clamping surface of said shoulder, and wherein said electrically conductive clamping collar contacts said electrically conductive shoulder portion;
   wherein said electrically conductive element comprises:
   an electrically conductive contact plane arranged in said substrate carrier at said shoulder; and
   a plurality of electrodes connected to said contact plane that are formed as plated-through holes, and that project from said top face to define said bearing plane.

2. The support according to claim 1, wherein said electrically conductive element comprises:
   a first strip arranged at the periphery of said top face;
   a second strip that extends over said cylinder between said first strip and said shoulder; and
   a third strip in contact with said second strip and arranged on said shoulder to form said electrically conductive shoulder portion.

3. The support according to claim 1, further including a strip arranged at the periphery of said top face under said bearing plane, and wherein said substrate carrier includes at least one orifice opening out in said top face and said bottom face.

4. The support according to claim 1, further including a gasket at the periphery of said bottom face in contact with said biased table.

5. The support according to claim 1, further including a thermally conductive layer interposed between said bottom face and said biased table.

6. The support according to claim 1, wherein said electrically conductive element comprises a conductive first portion arranged at said top face, said electrically conductive shoulder portion arranged on said shoulder for contact by said clamping collar, and a conductive connecting portion electrically contacting each of said first and shoulder portions.

7. The support according to claim 1, wherein said fasteners are screws.

8. A support comprising:
   an electrically conductive biased table;
   an insulating electrostatic substrate carrier in the form of a cylinder having a shoulder, a bottom face of the substrate carrier facing said biased table and a top face of the substrate carrier presenting a bearing plane designed to receive a substrate; and
   an electrically conductive clamping collar for contacting said shoulder at least at a clamping surface of said shoulder and clamping said shoulder against said biased table, said electrically conductive clamping collar configured to clamp, with a plurality of fasteners, the insulating electrostatic substrate carrier to the electrically conductive biased table by bearing against the shoulder;
   wherein the support includes at least one electrically conductive element for connecting said bearing plane to said clamping surface of said shoulder, wherein said at least one electrically conductive element includes an electrically conductive shoulder portion disposed at said clamping surface of said shoulder, and
   wherein said electrically conductive clamping collar contacts said electrically conductive shoulder portion,
   wherein said electrically conductive element comprises:
   a first strip arranged at the periphery of said top face;
   a second strip that extends over said cylinder between said first strip and said shoulder; and
   a third strip in contact with said second strip and arranged on said shoulder to form said electrically conductive shoulder portion;
   the support further including a plurality of electrodes that pass through said substrate carrier formed as plated-through holes and projecting from said top face, and that provide electrical contact between said biased table and said bearing plane.

9. The support according to claim 8, further including an electrically conductive layer interposed between said top face and said biased table and covering said shoulder.

10. A support comprising:
    an electrostatic substrate carrier having a shoulder and having a bottom face for facing an electrically biased table and a top face forming a bearing plane; and
    at least one electrically conductive element for connecting said bearing plane to a surface of said shoulder, said electrically conductive element including an electrically conductive shoulder portion disposed at said surface of said shoulder; and
    wherein said top face presents a ring at a periphery of the top face and studs distributed in the ring, the ring and the studs extending to a same axial height, and
    wherein said electrically conductive element comprises a metal strip arranged on the ring and extending continuously from the ring to the shoulder.

11. The support according to claim 10, wherein said electrically conductive element comprises a conductive first portion arranged on said top face, said electrically conductive shoulder portion arranged on said shoulder for contact by a clamping collar, and a conductive connecting portion electrically contacting each of said first and shoulder portions.

\* \* \* \* \*